United States Patent
Kannan et al.

(10) Patent No.: US 12,402,269 B2
(45) Date of Patent: Aug. 26, 2025

(54) UTILIZING INVERTIBLE ALPHANUMERIC SLOT IDENTIFIERS ON DEVICES

(71) Applicant: Dell Products L.P., Round Rock, TX (US)

(72) Inventors: Venkadesh Kannan, Bangalore (IN); Kalaiselvan Kalaimani, Bangalore (IN)

(73) Assignee: Dell Products L.P., Round Rock, TX (US)

( * ) Notice: Subject to any disclaimer, the term of this patent is extended or adjusted under 35 U.S.C. 154(b) by 200 days.

(21) Appl. No.: 18/238,069

(22) Filed: Aug. 25, 2023

(65) Prior Publication Data

US 2025/0071931 A1    Feb. 27, 2025

(51) Int. Cl.
*H05K 7/14* (2006.01)

(52) U.S. Cl.
CPC ......... *H05K 7/1498* (2013.01); *H05K 7/1492* (2013.01)

(58) Field of Classification Search
None
See application file for complete search history.

(56) References Cited

U.S. PATENT DOCUMENTS

| | | | |
|---|---|---|---|
| 7,889,508 B2* | 2/2011 | Sato | H05K 7/1461 361/741 |
| 9,176,648 B1* | 11/2015 | Laporte | G06F 3/0304 |
| 9,958,911 B2* | 5/2018 | Alvarado | G06F 1/183 |
| 11,096,305 B1* | 8/2021 | Peng | H05K 7/1418 |
| 11,109,498 B1* | 8/2021 | Cox | H05K 5/0247 |
| 2013/0291744 A1 | 11/2013 | Anthony et al. | |
| 2015/0241945 A1* | 8/2015 | Dube | H05K 7/1492 713/320 |
| 2021/0400142 A1 | 12/2021 | Jorasch et al. | |
| 2021/0409575 A1 | 12/2021 | Gregory | |

* cited by examiner

*Primary Examiner* — Xanthia C Relford
(74) *Attorney, Agent, or Firm* — BainwoodHuang

(57) ABSTRACT

Techniques are directed to utilizing invertible alphanumeric slot identifiers on devices. Along these lines, a device includes data storage circuitry, a housing that holds the data storage circuitry, and an alphanumeric marking on the housing. The device is constructed and arranged to insert into a first slot defined by a data storage chassis and electrically connect with an interconnect supported by the chassis during a first operating time and insert into a second slot defined by the data storage chassis and electrically connect with the interconnect during a second operating time. The alphanumeric marking displays the first alphanumeric slot identifier when the device is inserted into the first slot and displaying the second alphanumeric slot identifier when the device is inserted into the second slot. Such techniques reduce or eliminate instances of incorrect node pulls in storage equipment.

20 Claims, 5 Drawing Sheets

UTILIZING INVERTIBLE ALPHANUMERIC SLOT IDENTIFIERS ON DEVICES

BACKGROUND

A conventional data storage system includes an enclosure, a midplane, and two storage nodes. The midplane resides within the enclosure. The two storage nodes slide into the enclosure through openings on the backside to engage with the midplane.

Once the two storage nodes are slid into the enclosure through the openings on the backside to engage with the midplane, the two storage nodes are able to communicate with each other as well as other components such as storage drives and network modules through the midplane. Accordingly, the two storage nodes are able to robustly and reliably perform input/output (I/O) operations (e.g., read/write operations which access disks, etc.).

SUMMARY

It should be understood that the two storage nodes of the conventional data storage system may have the same form factor and may be interchangeable in their positions within the enclosure. Along these lines, each storage node may slide into a top storage node opening of the enclosure in a normal orientation to engage the midplane. Additionally, each storage node may slide into a bottom storage node opening of the enclosure in an inverted orientation to engage the midplane. A first decal with a capitalized "B" may be positioned at the outer edge of the top storage node opening (or slot) of the enclosure, and a second decal with a capitalized "A" may be positioned at the outer edge of the bottom storage node opening of the enclosure to distinguish the storage node openings from each other.

Once the conventional data storage system is populated with the two storage nodes and operational, the data storage system is able to enjoy high availability. Along these lines, if one storage node were to fail, the other storage node may continue to operate so that the data storage system remains up and running in a degraded mode.

Now, suppose that a particular storage node suffers a hardware failure and requires replacement. In such a situation, management software for the data storage system may instruct a technician to remove the failed storage node and install a new storage node in its place. For example, to replace the storage node in the top storage node opening, the management software may instruct the technician to replace the storage node adjacent the first decal with the capitalized "B". Alternatively, to replace the storage node in the bottom storage node opening, the management software may instruct the technician to replace the storage node adjacent the second decal with the capitalized "A".

Unfortunately, it may be difficult and/or confusing to the technician as to which storage node should be removed and replaced. Along these lines, some manufacturers may identify the top and bottom storage node openings by "B" and "A", respectively. However, other manufacturers may identify the top and bottom storage node openings in the opposite manner by "A" and "B", respectively.

Additionally, the decals at the outer edges of the storage node openings may be tiny and difficult to spot. However, making the decals larger could interfere with (e.g., block) access to the openings.

Furthermore, there may be cables and other componentry in front of the decals that hide or partially obscure the decals. Accordingly, the technician must often rely on familiarity, memory, training, etc. to know which storage node opening is identified with a capitalized "A" and which storage node opening is identified with a capitalized "B".

Moreover, if the technician inadvertently removes the non-failed storage node, the data storage system will go down. That is, removal of the last working storage node would mean that only the failed storage node remains connected within the data storage system. Accordingly, the data storage system will fall into a state of data unavailability (DU), and will no longer be able to perform data storage operations. At that point, additional time and work would now be required to perform recovery and bring the data storage system back up.

In contrast to the above-described conventional data storage system in which it is difficult to distinguish storage node openings, improved techniques are directed to utilizing a device (or node) showing an alphanumeric marking that displays a first alphanumeric slot identifier when the device is in a first orientation and that displays a second alphanumeric slot identifier when the device is in a second orientation that is different from the first orientation. The alphanumeric slot identifiers are invertible in that the alphanumeric slot identifiers are meaningful (or understandable) in both a right side up orientation and an upside down orientation. For example, the alphanumeric marking may be an ambigram-style symbol to display the letter "b" when engaged in a first chassis slot in an upright position, and display the letter "a" when engaged in a second chassis slot in an inverted position. Moreover, the alphanumeric marking may be conspicuously positioned on the device (e.g., on a central region of the device's housing that is unobscured by cables, etc.). Then, if a user is instructed to replace the device in the chassis slot labeled with the letter "b", there is only one installed device showing an alphanumeric marking that displays the letter "b" (the other installed device would show an alphanumeric marking that displays the letter "a"). Accordingly, the alphanumeric marking is easily recognizable and there is no confusion in properly identifying chassis slots. As a result, in the context of data storage equipment with redundancy, a user instructed to replace the device in the chassis slot labeled with the letter "b" will identify the correct chassis slot and will replace the correct device in that chassis slot and the data storage equipment remains available (e.g., up and running to perform data storage operation on behalf of a set of host computers).

One embodiment is directed to a device which includes data storage circuitry, a housing that holds the data storage circuitry, and an alphanumeric marking on the housing. The device is constructed and arranged to insert into a first slot defined by a data storage chassis and electrically connect with an interconnect supported by the chassis during a first operating time and insert into a second slot defined by the data storage chassis and electrically connect with the interconnect during a second operating time. The alphanumeric marking displays the first alphanumeric slot identifier when the device is inserted into the first slot and displaying the second alphanumeric slot identifier when the device is inserted into the second slot. Such techniques reduce or eliminate instances of incorrect node (or device) pulls in storage equipment.

Another embodiment is directed to data storage equipment which includes a chassis that defines a first slot which is identified by a first alphanumeric slot identifier and a second slot which is identified by a second alphanumeric slot identifier. The data storage equipment further includes an interconnect supported by the chassis. The data storage equipment further includes a device constructed and arranged to perform data storage operations when inserted into the first slot and electrically connected with the interconnect during a first operating time and when inserted into the second slot and electrically connected with the interconnect during a second operating time, the device showing an alphanumeric marking that displays the first alphanumeric slot identifier when the device is inserted into the first slot and displays the second alphanumeric slot identifier when the device is inserted into the second slot.

In some arrangements, the chassis is constructed and arranged to position the device right side up when the device is inserted into the first slot and position the device upside down when the device is inserted into the second slot.

In some arrangements, the alphanumeric marking of the device displays the first alphanumeric slot identifier when right side up and displays the second alphanumeric slot identifier when upside down.

In some arrangements, the device includes data storage circuitry, a housing that holds the data storage circuitry, and a label affixed to the housing. The label shows the alphanumeric marking.

In some arrangements, the housing defines a flat contiguous surface. Additionally, the label is a glow in the dark sticker that sticks to the flat contiguous surface defined by the housing.

In some arrangements, the alphanumeric marking is a single alphanumeric symbol.

In some arrangements, the single alphanumeric symbol is the letter "b" when the device is oriented right side up and the letter "a" when the device is oriented upside down, or vice versa.

In some arrangements, the data storage equipment further includes a first chassis marker disposed adjacent the first slot and displaying the first alphanumeric slot identifier, and a second chassis marker disposed adjacent the second slot and displaying the second alphanumeric slot identifier.

In some arrangements, the alphanumeric marking shown by the device matches the first chassis marker when device is right side up and matches the second chassis marker when the device is upside down.

In some arrangements, the data storage equipment further includes another device constructed and arranged to perform data storage operations when inserted into the second slot and electrically connected with the interconnect during the first operating time and when inserted into the first slot and electrically connected with the interconnect during the second operating time. The other device shows the alphanumeric marking that displays the first alphanumeric slot identifier when the other device is inserted into the first slot and displays the second alphanumeric slot identifier when the device is inserted into the second slot.

In some arrangements, the chassis is constructed and arranged to position the other device right side up when the device is inserted into the first slot and position the other device upside down when the device is inserted into the second slot.

In some arrangements, the device and the other device have a common form factor. Additionally, the device and the other device are constructed and arranged to simultaneously perform data storage operations when inserted into the first and second slots and electrically connected with the interconnect.

It should be understood that, in the cloud context, at least some electronic circuitry is formed by remote computer resources distributed over a network (e.g., remote resources that communicate with the device). Such an electronic environment is capable of providing certain advantages such as high availability and data protection, transparent operation and enhanced security, big data analysis, etc.

Other embodiments are directed to electronic systems and apparatus, processing circuits, computer program products, and so on. Some embodiments are directed to various methods (or processes), electronic components and circuitry which utilize invertible alphanumeric slot identifiers on devices (or nodes).

BRIEF DESCRIPTION OF THE DRAWINGS

The foregoing and other objects, features and advantages will be apparent from the following description of particular embodiments of the present disclosure, as illustrated in the accompanying drawings in which like reference characters refer to the same parts throughout the different views. The drawings are not necessarily to scale, emphasis instead being placed upon illustrating the principles of various embodiments of the present disclosure.

DETAILED DESCRIPTION

An improved technique is directed to utilizing a device (or node) showing an alphanumeric marking that displays a first alphanumeric slot identifier when the device is in a first orientation and that displays a second alphanumeric slot identifier when the device is in a second orientation that is different from the first orientation. For example, the alphanumeric marking may be an ambigram-style symbol that displays the letter "b" when engaged in a first chassis slot in an upright position, and displays the letter "a" when engaged in a second chassis slot in an inverted position. Moreover, the alphanumeric marking may be conspicuously positioned on the device (e.g., a flat contiguous surface on the device's housing that is unobscured by cables, etc.). Then, if a user is instructed to replace the device in the chassis slot labeled with the letter "b", there is only one currently inserted device showing an alphanumeric marking that displays the letter "b" (the other currently inserted device would show an alphanumeric marking that displays the letter "a"). Accordingly, the alphanumeric marking is easily recognizable and there is no confusion in properly identifying chassis slots. As a result, in the context of data storage equipment with device redundancy, a user who is instructed to replace the device in the chassis slot labeled with the letter "b" will identify the correct chassis slot and replace the correct device in that chassis slot and the data storage equipment will remain available (e.g., up and running to perform data storage operation on behalf of a set of host computers).

Figure 1:
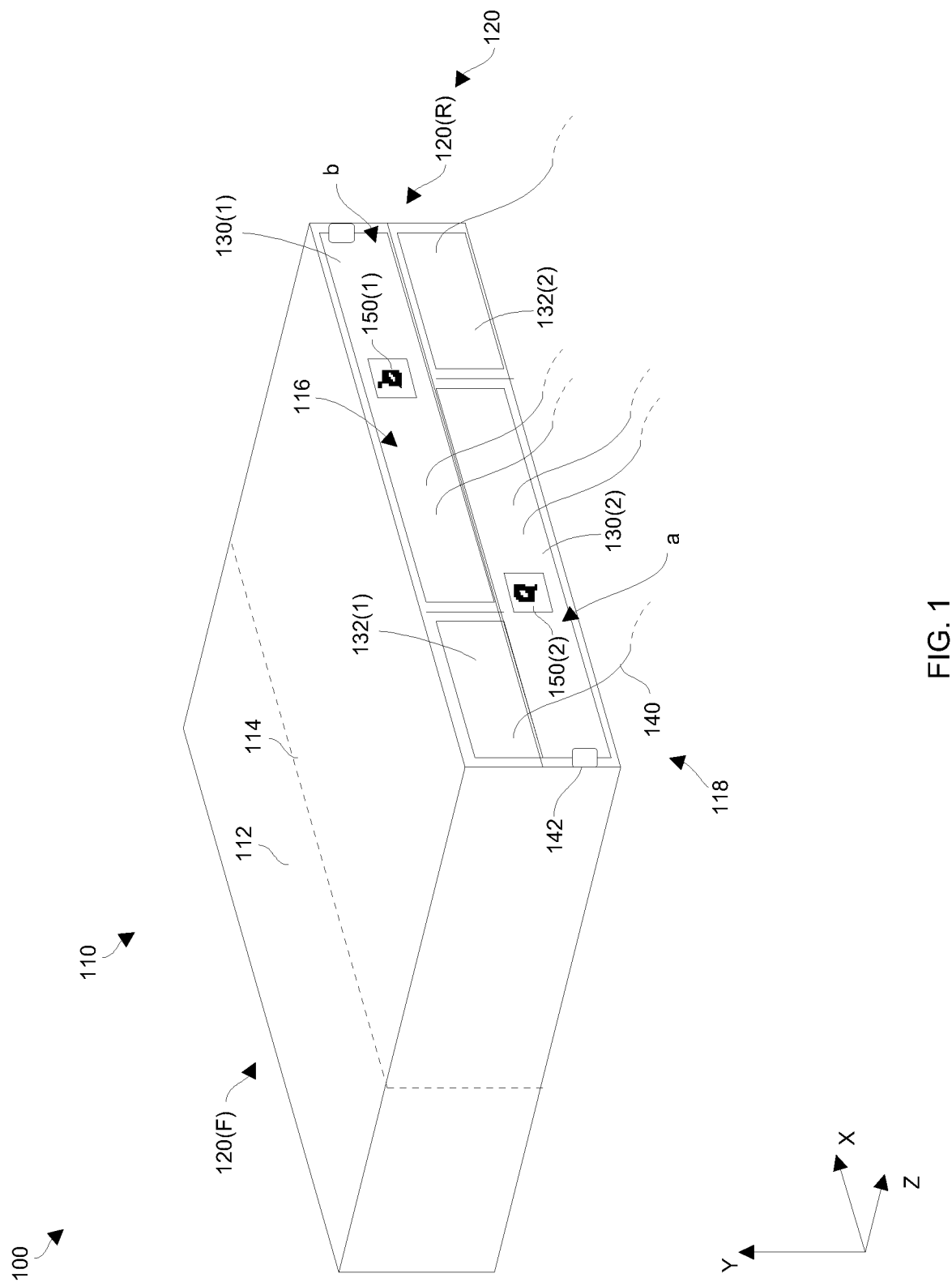
FIG. 1 is a perspective view of an electronic environment which utilizes invertible alphanumeric slot identifiers on devices in accordance with certain embodiments.

FIG. 1 shows an electronic environment 100 which utilizes invertible alphanumeric slot identifiers on devices in accordance with certain embodiments. The electronic environment 100 includes, by way of example, data storage equipment 110 constructed and arranged to perform data storage operations on behalf of a set of hosts. However, other types of equipment are suitable for use as well such as general purpose computing equipment, network equipment, processing equipment, specialized equipment, and so on.

As shown in FIG. 1, the data storage equipment 110 includes a chassis (or frame) 112, an interconnect 114, a set of devices 116, and additional componentry 118. Such data storage equipment 110 may be provisioned with redundant devices 116 for fault tolerance, e.g., high availability. Accordingly, the data storage equipment 110 may remain operational even after a device failure.

The chassis 112 of the data storage equipment 110 is constructed and arranged to support a variety of components such as the interconnect 114, the set of devices 116, and perhaps some of the additional componentry 118. The chassis 112 may perform a variety of operations such as mount to or within other structures (e.g., fasten to rack, reside within a cabinet, etc.), house/protect the interconnect 114 (shown in phantom in FIG. 1), provide access openings (or slots) 120 through which or within which various devices 116 may insert, control airflow, provide RF shielding, and so on. A variety of form factors are suitable for the chassis 112 such as a housing, an enclosure, a cage, a cabinet, a rack, a module assembly, and so on.

Along these lines, the chassis 112 defines a rear set of openings (or slots) 120(R) to receive and hold various components 116. In particular, as shown in FIG. 1, the rear set of openings (or slots) 120(R) receives multiple devices 130(1), 130(2) (collectively, devices 130), and multiple other devices 132(1), 132(2) (collectively, other devices 132). For proper installation, such devices 130, 132 are moved in the negative Z-direction and inserted into the chassis 112 through the rear set of openings 120(R). Moreover, such devices 130, 132 may be removed from the chassis 112 when the devices 130, 132 are moved in the positive Z-direction and withdrawn from the chassis 112 through the rear set of openings 120(R). Although the rear set of openings 120(R) is shown as including two openings 120 for two devices 132, the rear set of openings 120(R) includes more than two openings 120 for more than two devices 132 in other embodiments (e.g., three openings, four openings, and so on).

In accordance with certain embodiments, the chassis 110 further defines a front set of openings (or slots) 120(F) to receive and hold additional components 116. In some arrangements, the chassis 110 manages airflow in a front to back, or back to front manner, through the front and rear sets of openings 120(F), 120(R) for heat removal.

The interconnect 114 is constructed and arranged to provide connectivity among various devices 116. Such connectivity may involve delivering power and ground signals, conveying communications (e.g., data, control signals, status signals, etc.), combinations thereof, and so on. The interconnect 114 may take the form of a backplane, a midplane, a circuit board with active circuitry, etc. In some arrangements, the interconnect 114 is oriented and/or configured to enable end-to-end airflow through the chassis 112.

The devices (or nodes) 116 are constructed and arranged to perform a variety of operations. Along these lines, the devices 116 include first devices 130 of a first type to perform certain operations, and second devices 132 of a second type to perform other operations.

In the data storage equipment context, the devices 130 are storage nodes (e.g., storage processors or SPs) that perform data storage operations (e.g., read and write operations). In some arrangements, the other devices 132 are ancillary components (e.g., network interfaces, power converters, fan assemblies, expansion cards, storage units, combinations thereof, etc.). In some arrangements, at least some of the devices 116 are oriented and/or configured to enable end-to-end airflow through the chassis 112.

The additional componentry 118 refers to other apparatus/hardware such as external cables 140 (e.g., power cords, network cables, etc.), tags 142 that identify certain openings 120, handles, arms/latches, brackets, attachment hardware, wire ties/guides, combinations thereof, etc. Moreover, it should be understood that within the electronic environment 100 there may exist adjacent equipment/hardware such as power cords and/or network cables dangling in front of the rear set of openings 120(R) leading to or extending from one or more other chassis/enclosures/equipment/etc.

In accordance with certain embodiments, the rear set of openings 120(R) defined by the chassis 112 includes a slot (or opening) "b" in the top (or upper) right corner, and a slot (or opening) "a" in the bottom (or lower) left corner (also see FIG. 1) to receive the same type of device 130. Along these lines, the devices (or nodes) 130(1), 130(2) have the same (or similar) geometry and are interchangeable in the sense that either of the devices 130(1), 130(2) may properly install into slot "b" or slot "a". In particular, the device 130(1) may install right-side up into slot "b" or upside down into slot "a". Likewise, the device 130(2) may install right-side up into slot "b" or upside down into slot "a".

Accordingly, both of the devices 130(1), 130(2) may be properly installed within the chassis 112 at the same time, i.e., one of the devices 130(1), 130(2) may be installed in slot "b" and the other of the devices 130(1), 130(2) may be installed concurrently in slot "a". In this situation, the data storage equipment 110 is able to enjoy rich and reliable operation with high availability (e.g., load balancing, fault tolerance, etc.). If one of the devices 130(1), 130(2) fails, the other of the devices 130(1), 130(2) is still operational so that the data storage equipment 110 remains operational.

As will be explained in further detail below, the devices 130(1), 130(2) are provisioned with invertible alphanumeric markings to enable a user to easily discern the chassis openings 120 (or slots) within which the devices 130(1), 130(2) currently reside. Such alphanumeric markings are considered invertible since the alphanumeric markings are easily discernable as meaningful alphanumeric symbols (e.g., legitimate characters, legitimate letters, combinations thereof, etc.) if they are right side up and/or if they are upside down. Along these lines, a capital "A" in times new roman font is not understandable if viewed upside down. However, the small case letter "a" is easily understandable in some fonts if viewed upside down as the small case letter "b" and is thus well suited for use in these fonts as an invertible alphanumeric marking.

Moreover, it should be understood that the small case letter "a" is used to identify the bottom slot and the small case letter "b" is used to identify the top slot by way of example only. In other arrangements, the small case letter "b" is used to identify the bottom slot and the small case letter "a" is used to identify the top slot. Furthermore, other letters, numbers, symbols, combinations thereof, etc. are suitable for use.

Figure 2:
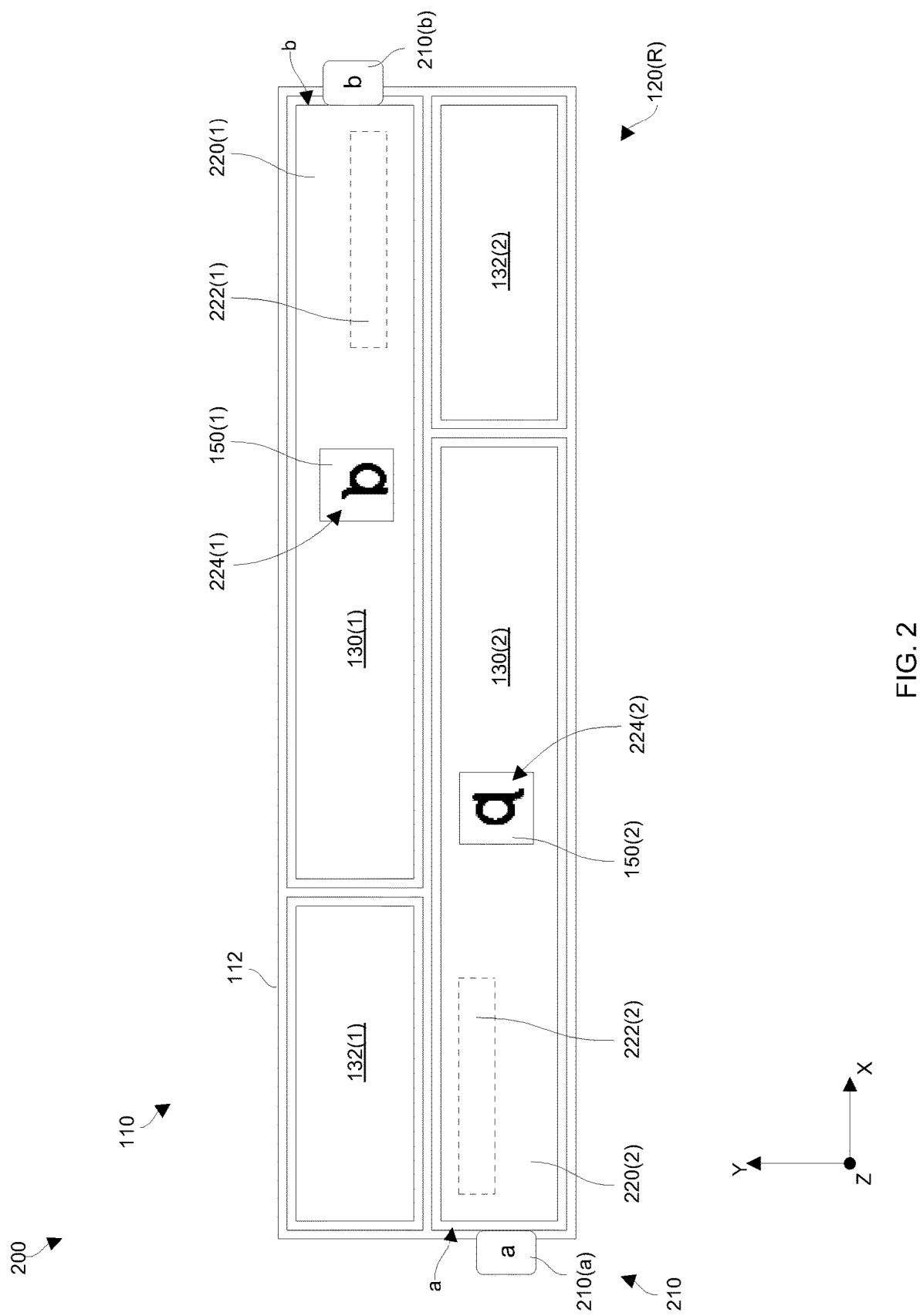
FIG. 2 is a rear view of data storage equipment of the electronic environment in accordance with certain embodiments.

FIG. 2 shows a front view 200 of the data storage equipment 110 (i.e., viewed looking in the negative Z-direction) in accordance with certain embodiments. Certain components (e.g., cords, cables, etc.) may have be omitted from FIG. 2 to better show certain details.

As explained earlier in connection with FIG. 1, the chassis 112 defines a rear set of openings (or slots) 120(R). Along these lines, the rear set of openings 120(R) includes slot "b" (see the top right corner of the front view 200 in FIG. 2) and slot "a" (see the bottom left corner of the front view 200 in FIG. 2).

In accordance with certain embodiments, certain openings 120(R) are identified by respective tags 210 (also see the tags 142 of the additional componentry 118 in FIG. 1). Along these lines and as shown in FIG. 2, slot "b" is labeled with a tag 210(b) that is affixed to the chassis along the outer edge of slot "b" and that presents a first alphanumeric slot identifier "b". Similarly, slot "a" is labeled with a tag 210(a) that is affixed to the chassis along the outer edge of slot "a" on the opposite side of the chassis 112 and that presents a second alphanumeric slot identifier "a".

As shown in FIG. 2, the devices 130(1), 130(2), 132(1), 132(2) are currently installed within the chassis 112. That is, the devices 130(1), 130(2), 132(1), 132(2) have been inserted within respective slots 120(R) and connect with the interconnect 114 (also see FIG. 1). Accordingly, the devices 130(1), 130(2), 132(1), 132(2) are able to operate to perform useful work.

Along these lines, the device 130(1) is currently oriented in a right-side up orientation within slot "b". That is, while the device 130(1) resides within slot "b", a top of the device 130(1) faces (or points) in the positive Y-direction, and a bottom of the device 130(1) faces (or points) in the negative Y-direction.

In contrast, the device 130(2) is currently oriented in an upside down orientation within slot "a". That is, while the device 130(2) resides within slot "a", a top of the device 130(2) faces in the negative Y-direction, and a bottom of the device 130(2) faces in the positive Y-direction.

Moreover, as mentioned earlier, the devices 130(1), 130(2) are interchangeable within the chassis 112. Accordingly, the device 130(1) fits within slot "a" if inserted into slot "a" in the upside down orientation. Likewise, the device 130(2) fits within slot "b" if inserted into slot "b" in the right-side up orientation.

As further shown in FIG. 2, the devices 130(1), 130(2) include respective device housings 220(1), 220(2), respective circuitry 222(1), 222(2) (shown in phantom for simplicity), and respective alphanumeric markings 224(1), 224(2). In particular, in connection with the device 130(1), the circuitry 222(1) is disposed (or protected) within the housing 220(1) and the alphanumeric marking 224(1) is disposed on an outer surface of the housing 220(1) such that the alphanumeric marking 224(1) is easily viewed when looking at the front view 200 of the data storage equipment 110. Likewise, in connection with the device 130(2), the circuitry 222(2) is disposed (or protected) within the housing 220(2) and the alphanumeric marking 224(2) is disposed on an outer surface of the housing 220(2) such that the alphanumeric marking 224(2) is easily viewed when looking at the front view 200 of the data storage equipment 110.

As clearly seen in FIG. 2, the alphanumeric marking 224(1) of the device 130(1) which is installed within slot "b" displays the first alphanumeric slot identifier that identifies slot "b". Moreover, the alphanumeric slot identifier displayed by the alphanumeric marking 224(1) matches the alphanumeric slot identifier presented by the tag 210(b) (i.e., these alphanumeric slot identifiers are the same).

Likewise, the alphanumeric marking 224(2) of the device 130(2) which is installed within slot "a" displays the second alphanumeric slot identifier that identifies slot "a". Moreover, the alphanumeric slot identifier displayed by the alphanumeric marking 224(2) matches the alphanumeric slot identifier presented by the tag 210(a) (i.e., these alphanumeric slot identifiers are the same).

It should be clear at this point that the alphanumeric slot identifiers displayed by the alphanumeric markings 224(1), 224(2) are the same (e.g., identical). Moreover, the alphanumeric markings 224(1), 224(2) are invertible in that the alphanumeric slot identifiers are comprehendible as properly oriented alphanumeric characters (rather than merely a unique design) in both a right side up orientation and an upside down orientation.

In some arrangements, the alphanumeric markings 224(1), 222(2) take the form of glow in the dark (or similarly highly noticeable) stickers (or labels) which affix to the housings 220(1), 222(2). Such glow in the dark stickers are easy to apply and then easy to find/ascertain when looking at the front 200 of the data storage equipment 110.

Such a glow in the dark feature may be effectuated using special materials (e.g., ink, paint, dyes, etc.). For example, the materials may be fluorescent, phosphorescent, reflective, metallic, have other luminous properties, combinations thereof, etc. Alternatively, different contrasting colors may be used (e.g., bright yellow on black), or use different paints that respond to different types of light (e.g., daylight, UV, etc.), and so on.

As just mentioned, the alphanumeric markings 224(1), 224(2) are the same. Nevertheless, when either of the devices 130(1), 130(2) is installed with slot "b" in the right side up orientation, the alphanumeric markings 224(1), 224(2) display the first alphanumeric slot identifier that identifies slot "b". Additionally, when either of the devices 130(1), 130(2) is installed with slot "a" in the upside down orientation, the alphanumeric markings 224(1), 224(2) display the first alphanumeric slot identifier that identifies slot "a".

Based on the above, one will appreciate that the alphanumeric markings 224(1), 224(2) will not only assist a user in distinguishing between slot "a" and slot "b", the alphanumeric markings 224(1), 224(2) may be easier to see than the tags 210 due to their centralized locations within the view 200. In fact, in accordance with certain embodiments that utilize both the alphanumeric markings 224(1), 224(2) and the tags 210(b), 210(a), an advantageous feature is that the alphanumeric markings 224(1), 224(2) provide viewing redundancy in the event that the user does not easily see or only partially sees the tags 210(b), 210(a). With such added viewing redundancy/reinforcement, the user will not inadvertently identify the chassis slots "b" and "a" incorrectly.

Now, suppose that the data storage equipment 110 runs with the devices 130(1), 130(2) installed as shown in FIG. 2 for a period of time. During this time, the devices 130(1), 130(2) may perform data storage operations on behalf of a set of host computers. Along these lines, the devices 130(1), 130(2) may read host data from and write host data into secondary storage (e.g., solid state drives, magnetic disk drives, combinations thereof, etc.). Such operations may be block based, file based, or both block and file based. Moreover, the devices 130(1), 130(2) may be configured so that if one of the devices 130(1), 130(2) fails, the other of the devices 130(1), 130(2) may continue to operate so that the data storage equipment 110 remains up and running thus avoiding data unavailability and the need to perform data recovery.

At some point, suppose that one of the devices 130(1), 130(2) fails. In this situation, the failed one of the devices 130(1), 130(2) is no longer operational and requires replacement. However, the non-failed one of the devices 130(1), 130(2) remains operational and, if inadvertently removed from the chassis 112, would leave only the failed one of the devices 130(1), 130(2) installed within the chassis 112 thus leading to data unavailability and the need to perform data recovery.

When one of the devices 130(1), 130(2) fails, a management application may alert a user and instruct the user to replace the failed one of the devices 130(1), 130(2) by identifying the particular chassis opening 120 that holds the failed device 130. Here, if the non-failed one of the devices 130(1), 130(2) were to fail such that there are no remaining non-failed devices 130, the data storage equipment 110 would enter a data unavailable state. Further details will now be provided with reference to FIG. 3.

Figure 3:
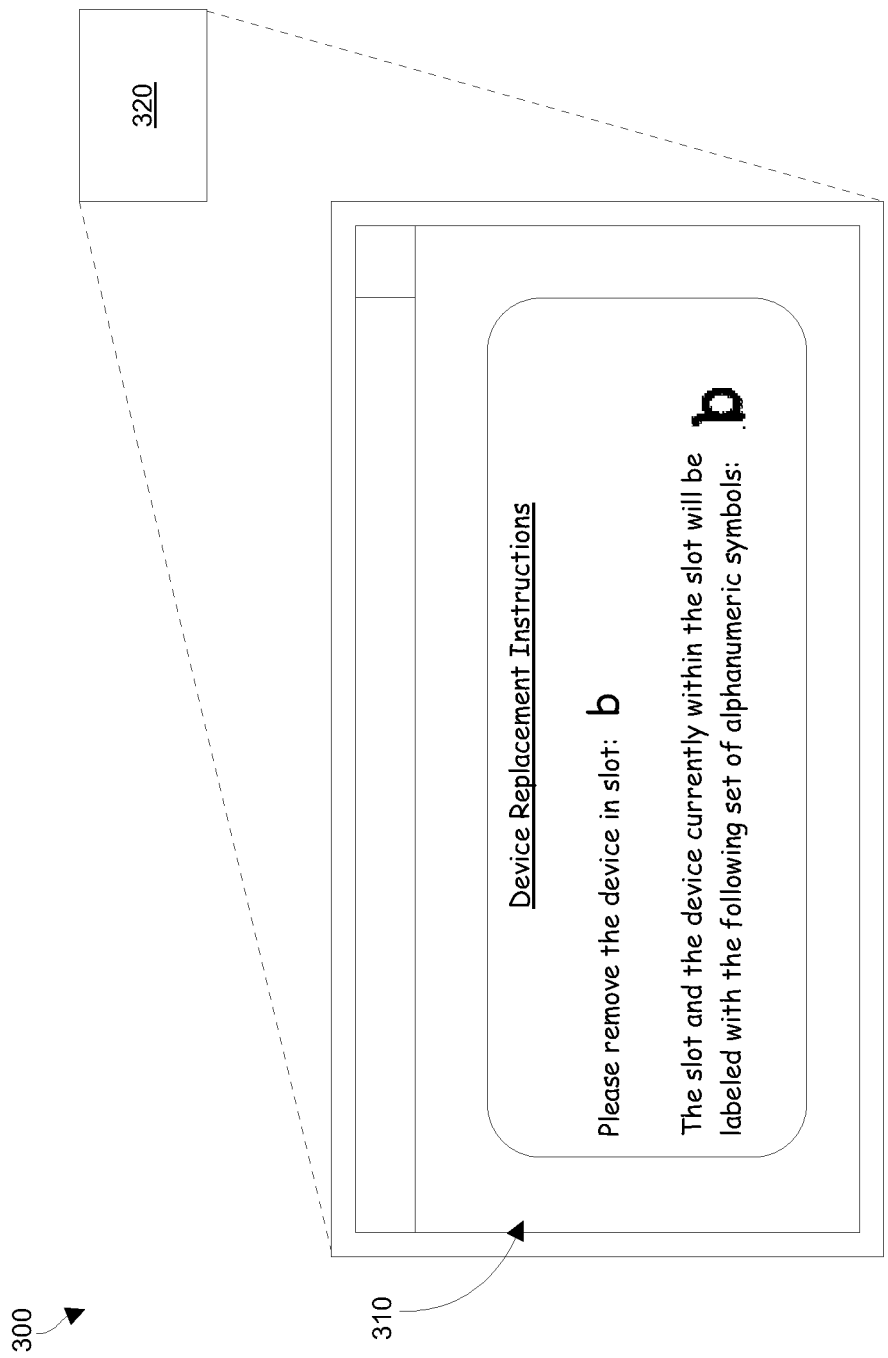
FIG. 3 is a view of a set of example instructions provided to a user to replace a device of the data storage equipment in accordance with certain embodiments.

FIG. 3 shows a view 300 of a set of example instructions 310 provided to a user from a management application 320 to replace a device 130 of the data storage equipment 110 in accordance with certain embodiments. The management application 320 may run within the data storage equipment 110 itself (e.g., see the circuitry 222(1), 222(2) in FIG. 2) or externally to monitor operation of the data storage equipment 110 (FIG. 1). The view 300 may be a window (e.g., a graphical user interface, a webpage, etc.) provided on an electronic display by the management application 320 to provide control/status/etc. to the user.

As shown in FIG. 3 and by way of example, the set of example instructions 310 directs the user to remove the device in slot "b" of the chassis 112. In further detail, the set of example instructions 310 indicates that the slot and the device will be labeled with a certain set of alphanumeric symbols, e.g., an alphanumeric symbol identifying the letter "b".

It should be appreciated that the set of alphanumeric symbols is an alphanumeric marking that displays the earlier-mentioned first alphanumeric slot identifier corresponding to the letter "b". Accordingly, even if the user is unable to view any tags 210(a), 210(b) along the edges of the chassis 112 (also see FIG. 2) due to obstructing additional componentry 118 (also see FIG. 1), the user is able to easily see the alphanumeric markings 224(1), 224(2) located in the central areas of the devices 130(1), 130(2) (also see FIG. 2). As a result, the user is able to effectively and efficiently identify the proper slot from which to remove the failed device 130(1) from slot "b".

Figure 4:
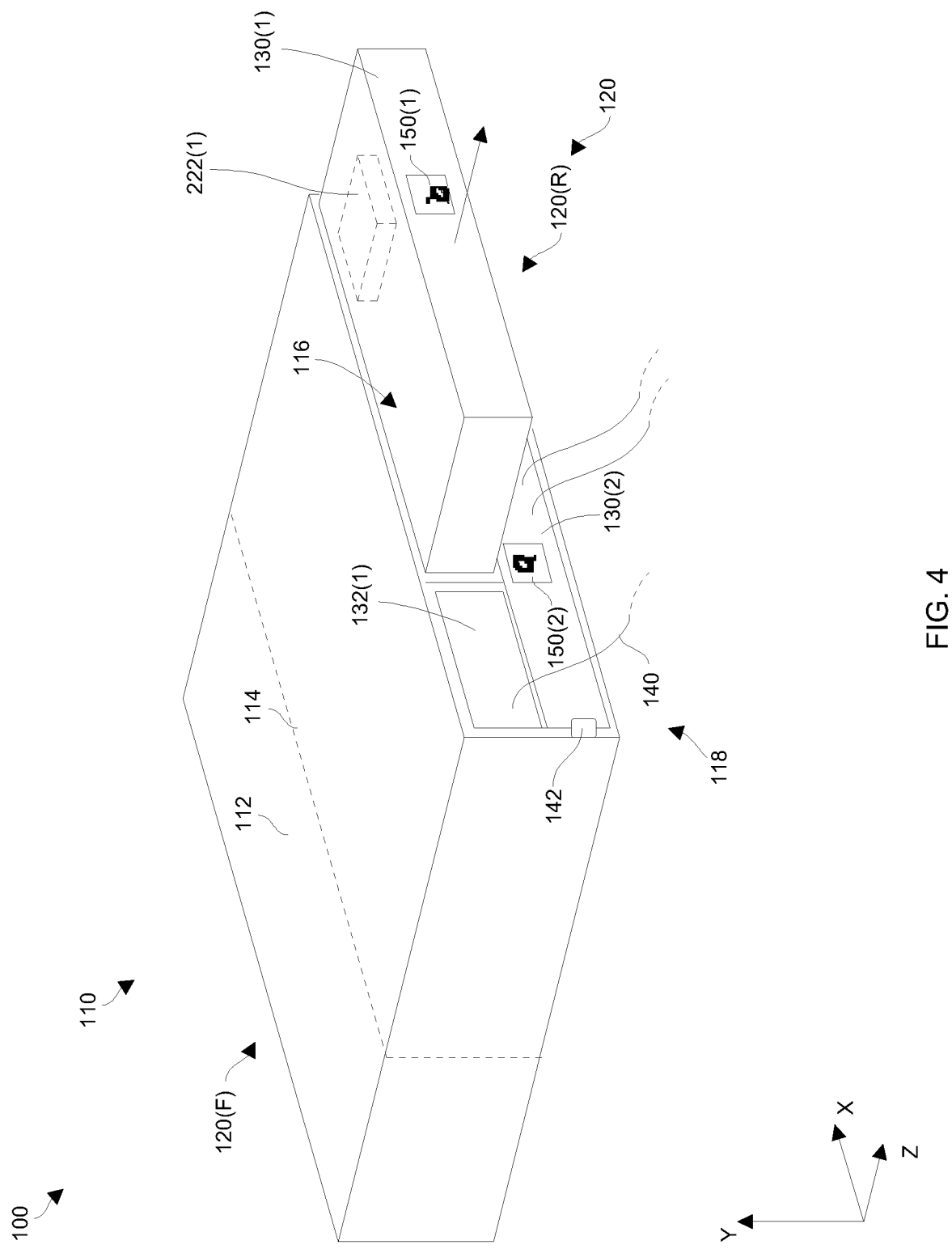
FIG. 4 is a perspective view of the electronic environment when the user follows the set of example instructions in accordance with certain embodiments.

FIG. 4 shows the failed device 130(1) partially removed (or pulled) from slot "b". In some arrangements, the user may be able to pull on a hardware mechanism such as a handle, an arm, a latch, etc. to disengage/disconnect the device 130(1) from the interconnect 114 and extract the device 130(1) from slot "b".

Now, in the alternative, suppose that the other of the devices 130(1), 130(2) failed. That is, suppose that the device 130(2) in slot "a" failed instead of the device 130(1) in slot "b". In such a situation, the management application 320 may alert the user and instruct the user to replace the device 130(2) in slot "a".

Along these lines, the view 300 of the set of example instructions 310 in FIG. 3 would instruct the user to remove the device in slot "a" of the chassis 112. That is, the set of example instructions 310 would indicate that the slot and the device will be labeled with a certain set of alphanumeric symbols, e.g., an alphanumeric symbol identifying the letter "a".

Here, it should be appreciated that the set of alphanumeric symbols is an alphanumeric marking that displays the earlier-mentioned second alphanumeric slot identifier corresponding to the letter "a". Accordingly, even if the user is unable to view any tags 210(a), 210(b) along the edges of the chassis 112 (also see FIG. 2) due to obstructing additional componentry 118 (also see FIG. 1), the user is able to easily see the alphanumeric markings 224(1), 224(2) located in the central areas of the devices 130(1), 130(2) (also see FIG. 2). As a result, the user is able to effectively and efficiently identify the proper slot from which to remove the failed device 130(2) from slot "a".

In connection with FIG. 4, the user would remove the failed device 130(2) from slot "a" rather than the device 130(1) from slot "b". Again, in some arrangements, the user may be able to pull on a hardware mechanism such as a handle, an arm, a latch, etc. to disengage/disconnect the device 130(2) from the interconnect 114 and extract the device 130(2) from slot "a". Once the failed device 130 is removed, a new/replacement device 130 may be inserted in place of the failed device 130 to restore redundancy. Further details will now be provided with reference to FIG. 5.

Figure 5:
FIG. 5 is a set of views with ambigram-style symbols suitable for identifying slots of the electronic environment in accordance with certain embodiments.

FIG. 5 shows various ambigram-style symbols suitable for identifying slots of the data storage environment in accordance with certain embodiments. The ambigram-style symbols are shown in right side up orientations on the left, and upside down orientations on the right. Regardless of the orientation (right side up vs upside down), the ambigram-style symbols are perceived as particular (or meaningful) alphanumeric characters.

It should be understood that, in each of the ambigram-style symbol pairings in FIG. 5, the right side up orientated alphanumeric symbol on the left is easily discernable as the letter "a". Additionally, the upside down orientated alphanumeric symbol on the right is easily discernable as the letter "b". Advantageously, the letters "a" and "b" are adjacent in the alphabet and thus well suited for identifying adjacent chassis locations in which devices install in either a right side up or upside down orientation.

Nevertheless, other alphanumeric symbols are suitable for use as well (e.g., other letters, other numbers, combinations thereof, etc.). For example, using certain fonts, the number "2" when inverted is discernable as the number "7". Likewise, using certain fonts, the number "6" when inverted is discernable as the number "9", and so on.

Moreover, although FIG. 5 shows single alphanumeric symbols for use as alphanumeric markings that display alphanumeric slot identifiers, multiple alpha numeric symbols are suitable for use as well. Along these lines, individual alphanumeric symbols may be combined to form alphanumeric markings that display alphanumeric slot identifiers.

As described above, improved techniques are directed to utilizing a device (or node) showing an alphanumeric marking that displays a first alphanumeric slot identifier when the device is in a first orientation and that displays a second alphanumeric slot identifier when the device is in a second orientation that is different from the first orientation. For example, the alphanumeric marking may be an ambigram-style symbol to display the letter "b" when engaged in a first chassis slot in an upright position, and display the letter "a" when engaged in a second chassis slot in an inverted position. Moreover, the alphanumeric marking may be conspicuously positioned on the device (e.g., on a central region of the device's housing that is unobscured by cables, etc.). Then, if a user is instructed to replace the device in the chassis slot labeled with the letter "b", there is only one device showing an alphanumeric marking that displays the letter "b" (the other device would show an alphanumeric marking that displays the letter "a"). Accordingly, the alphanumeric marking is easily recognizable and there is no confusion in properly identifying chassis slots. As a result, in the context of data storage equipment with redundancy, a user instructed to replace the device in the chassis slot labeled with the letter "b" will identify and replace the correct device and the data storage equipment remains available (e.g., up and running to perform data storage operation on behalf of a set of host computers). Such techniques reduce or eliminate instances of incorrect node pulls in storage equipment.

While various embodiments of the present disclosure have been particularly shown and described, it will be understood by those skilled in the art that various changes in form and details may be made therein without departing from the spirit and scope of the present disclosure as defined by the appended claims.

It should be appreciated that every year due to wrong controller/IO module pulls, there have been equipment operators who end up with data unavailability. Such a situation can happen to the smartest equipment operators. In such a situation, the same module/controller goes upside down in bottom slot.

Accordingly, simply printing a label for attachment along chassis edges to identify chassis slots may be ineffective. As an alternative, LEDs could be added but this approach involves including extra electronic components, which would add cost as well service issues (e.g., testing LEDs, new procedures if/when the LEDs fail, etc.).

Unfortunately, print on conventional chassis are often hidden by cables or other things (e.g., other stickers). Furthermore, such print may be very small and thus unnoticeable at most of the times.

However, in accordance with certain embodiments, nodes (e.g., controller devices) are provided with ambigram-style symbols that identify the slots the nodes are currently in. Placement of ambigram labels helps in creating guidance operators to pull correct nodes.

In some arrangements, ambigram labels/stamps are printed using glow in the dark material to assist operators in dark or dimly lit places. Such use of ambigram glow in the dark stickers reduces incorrect node pulls in storage.

The individual features of the various embodiments, examples, and implementations disclosed within this document can be combined in any desired manner that makes technological sense. Furthermore, the individual features are hereby combined in this manner to form all possible combinations, permutations and variants except to the extent that such combinations, permutations and/or variants have been explicitly excluded or are impractical. Support for such combinations, permutations and variants is considered to exist within this document. Such modifications and enhancements are intended to belong to various embodiments of the disclosure.

What is claimed is:

1. Data storage equipment, comprising:
a chassis that defines a first slot which is identified by a first alphanumeric slot identifier and a second slot which is identified by a second alphanumeric slot identifier;
an interconnect supported by the chassis; and
a device constructed and arranged to perform data storage operations when inserted into the first slot and electrically connected with the interconnect during a first operating time and when inserted into the second slot and electrically connected with the interconnect during a second operating time, the device showing an alphanumeric marking that displays the first alphanumeric slot identifier when the device is inserted into the first slot and displays the second alphanumeric slot identifier when the device is inserted into the second slot;
wherein the device includes:
data storage circuitry;
a housing that holds the data storage circuitry; and
a label affixed to the housing, the label showing the alphanumeric marking;
wherein the housing defines a flat contiguous surface; and
wherein the label is a glow in the dark sticker that sticks to the flat contiguous surface defined by the housing.

2. Data storage equipment as in claim 1 wherein the chassis is constructed and arranged to position the device right side up when the device is inserted into the first slot and position the device upside down when the device is inserted into the second slot.

3. Data storage equipment as in claim 2 wherein the alphanumeric marking of the device displays the first alphanumeric slot identifier when right side up and displays the second alphanumeric slot identifier when upside down.

4. Data storage equipment as in claim 1 wherein the alphanumeric marking is a single alphanumeric symbol.

5. Data storage equipment as in claim 4 wherein the single alphanumeric symbol is the letter "b" when the device is oriented right side up and the letter "a" when the device is oriented upside down.

6. Data storage equipment as in claim 1, further comprising:
a first chassis marker disposed adjacent the first slot and displaying the first alphanumeric slot identifier; and
a second chassis marker disposed adjacent the second slot and displaying the second alphanumeric slot identifier.

7. Data storage equipment as in claim 6 wherein the alphanumeric marking shown by the device matches the first chassis marker when device is right side up and matches the second chassis marker when the device is upside down.

8. Data storage equipment as in claim 1, further comprising:
another device constructed and arranged to perform data storage operations when inserted into the second slot and electrically connected with the interconnect during the first operating time and when inserted into the first slot and electrically connected with the interconnect during the second operating time, the other device showing the alphanumeric marking that displays the first alphanumeric slot identifier when the other device is inserted into the first slot and displays the second alphanumeric slot identifier when the device is inserted into the second slot.

9. Data storage equipment as in claim 8 wherein the chassis is constructed and arranged to position the other device right side up when the device is inserted into the first slot and position the other device upside down when the device is inserted into the second slot.

10. Data storage equipment as in claim 8 wherein the device and the other device have a common form factor; and
wherein the device and the other device are constructed and arranged to simultaneously perform data storage operations when inserted into the first and second slots and electrically connected with the interconnect.

11. A device, comprising:
data storage circuitry;
a housing that holds the data storage circuitry; and
an alphanumeric marking on the housing, the device being constructed and arranged to insert into a first slot defined by a data storage chassis and electrically connect with an interconnect supported by the chassis during a first operating time and insert into a second slot defined by the data storage chassis and electrically connect with the interconnect during a second operating time, the alphanumeric marking displaying the first alphanumeric slot identifier when the device is inserted into the first slot and displaying the second alphanumeric slot identifier when the device is inserted into the second slot;

wherein the alphanumeric marking of the device displays the first alphanumeric slot identifier when right side up and displays the second alphanumeric slot identifier when upside down.

12. The device as in claim 11, further comprising:
a label affixed to the housing, the label showing the alphanumeric marking.

13. The device as in claim 12 wherein the housing defines a flat contiguous surface; and
wherein the label is a glow in the dark sticker that sticks to the flat contiguous surface defined by the housing.

14. The device as in claim 13 wherein the alphanumeric marking is a single alphanumeric symbol.

15. The device as in claim 14 wherein the single alphanumeric symbol is the letter "b" when the device is oriented right side up and the letter "a" when the device is oriented upside down.

16. Data storage equipment, comprising:
a chassis that defines a first slot which is identified by a first alphanumeric slot identifier and a second slot which is identified by a second alphanumeric slot identifier;
an interconnect supported by the chassis;
a device constructed and arranged to perform data storage operations when inserted into the first slot and electrically connected with the interconnect during a first operating time and when inserted into the second slot and electrically connected with the interconnect during a second operating time, the device showing an alphanumeric marking that displays the first alphanumeric slot identifier when the device is inserted into the first slot and displays the second alphanumeric slot identifier when the device is inserted into the second slot;
a first chassis marker disposed adjacent the first slot and displaying the first alphanumeric slot identifier; and
a second chassis marker disposed adjacent the second slot and displaying the second alphanumeric slot identifier; and
wherein the alphanumeric marking shown by the device matches the first chassis marker when device is right side up and matches the second chassis marker when the device is upside down.

17. Data storage equipment as in claim 16 wherein the chassis is constructed and arranged to position the device right side up when the device is inserted into the first slot and position the device upside down when the device is inserted into the second slot.

18. Data storage equipment as in claim 17 wherein the alphanumeric marking of the device displays the first alphanumeric slot identifier when right side up and displays the second alphanumeric slot identifier when upside down.

19. Data storage equipment as in claim 16 wherein the alphanumeric marking is a single alphanumeric symbol.

20. Data storage equipment as in claim 16, further comprising:
another device constructed and arranged to perform data storage operations when inserted into the second slot and electrically connected with the interconnect during the first operating time and when inserted into the first slot and electrically connected with the interconnect during the second operating time, the other device showing the alphanumeric marking that displays the first alphanumeric slot identifier when the other device is inserted into the first slot and displays the second alphanumeric slot identifier when the device is inserted into the second slot.

* * * * *